US008767361B1

(12) United States Patent
Ozard

(10) Patent No.: US 8,767,361 B1
(45) Date of Patent: Jul. 1, 2014

(54) PROTECTION CIRCUIT FOR AN ELECTRONIC CIRCUIT

(71) Applicant: Anadigics, Inc., Warren, NJ (US)

(72) Inventor: Kenneth Sean Ozard, Middlesex, NJ (US)

(73) Assignee: Anadigics, Inc., Warren, NJ (US)

( * ) Notice: Subject to any disclaimer, the term of this patent is extended or adjusted under 35 U.S.C. 154(b) by 61 days.

(21) Appl. No.: 13/621,357

(22) Filed: Sep. 17, 2012

Related U.S. Application Data

(60) Provisional application No. 61/626,248, filed on Sep. 23, 2011.

(51) Int. Cl.
*H01C 7/12* (2006.01)
*H02H 1/00* (2006.01)
*H02H 1/04* (2006.01)
*H02H 3/22* (2006.01)
*H02H 9/06* (2006.01)

(52) U.S. Cl.
USPC .......................................... 361/56; 361/118

(58) Field of Classification Search
CPC ............................. H01L 27/0249; H01L 23/60
USPC ..................................................... 361/56, 118
See application file for complete search history.

(56) References Cited

PUBLICATIONS

JP-2011-00806, Inventor: Tatsumi Takaaki, Title: Protection element, and semiconductor device having protection element; Drawings 1-3.*

* cited by examiner

*Primary Examiner* — Dharti Patel
(74) *Attorney, Agent, or Firm* — William L. Botjer

(57) ABSTRACT

A protection circuit for an electronic circuit. The protection circuit comprises at least three diodes connected in series in such a manner that an anode terminal of a first diode is connected to a cathode terminal of a second diode to form a ring. A first terminal is connected between diodes of a first pair of consecutive diodes of the ring. A second terminal is connected between diodes of a second pair of consecutive diodes of the ring. The position of the first terminal is fixed and the position of the second terminal is selectable in such a manner that a pre-determined turn-on voltage of the at least three diodes is obtained. The diodes are formed under one or more bond pads of the electronic circuit.

19 Claims, 7 Drawing Sheets

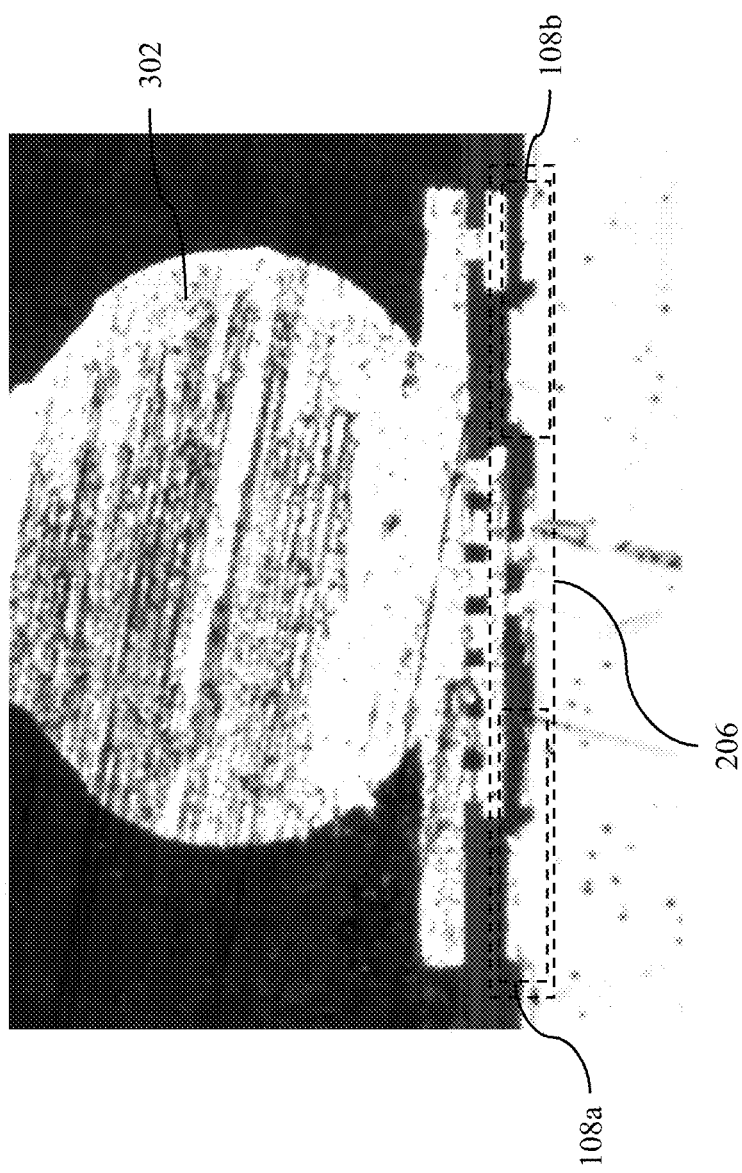

US 8,767,361 B1

PROTECTION CIRCUIT FOR AN ELECTRONIC CIRCUIT

CROSS REFERENCE TO RELATED APPLICATION

This application claims priority from the U.S. provisional application No. 61/626,248, titled "ESD structure", filed on Sep. 23, 2011, the disclosure of which is hereby incorporated by reference.

TECHNICAL FIELD

The present disclosure relates to a protection circuit for various electronic circuits and components thereof. More particularly, the present disclosure relates to a protection circuit that protects the electronic circuits from electrostatic discharge (ESD) and impedance mismatches (i.e., power amplifier ruggedness).

BACKGROUND OF THE INVENTION

A protection circuit protects an electronic circuit from damages caused by ESD and impedance mismatches (i.e., power amplifier ruggedness). The electronic circuit is protected from such damage by diverting the currents from excessive applied voltages/electric fields to an alternative path provided by the ESD protection circuit. ESD protection circuitry is described in my U.S. patent application Ser. No. 13/545,214 filed Jul. 10, 2012; the disclosure of which is hereby incorporated by reference.

The protection circuit is connected between nodes of the electronic circuit being protected. Different configurations of the protection circuit are required for compatibility with the variety of different circuit nodes (such as DC versus RF, input versus output, low versus high voltage, etc) and the variety of different types and/or magnitudes of ESD or overstress events which the differing nodes require protection from.

The cost of integrated circuits is usually proportional to the size of the integrated circuit die, and it is therefore desirable to find techniques to reduce the area added by the protection circuit. It is also highly desirable that the protection circuit not add any substantial cost or size to the integrated circuit containing the protection circuits or to the development process owing to re-designing, re-fabrication, and re-characterization of the different configurations.

SUMMARY OF THE INVENTION

According to embodiments illustrated therein, there is provided a protection circuit for protecting an electronic circuit from electrostatic discharge comprising one or more bond pads. The protection circuit comprises at least three diodes connected in series in such a manner that an anode terminal of a first diode is connected to a cathode terminal of a second diode to form a ring. A first terminal is connected between diodes of a first pair of consecutive diodes of the ring. A second terminal is connected between diodes of a second pair of consecutive diodes of the ring. The position of the first terminal is fixed and the position of the second terminal is selectable in such a manner that a pre-determined turn-on voltage of the at least three diodes is obtained. The at least three diodes are formed underneath the one or more bond pads of the electronic circuit by applying an inter layer dielectric (ILD) metallization technique to the analog compound semiconductor process, and the at least three diodes are fabricated out of the epitaxial layers of an InGaP HBT process.

BRIEF DESCRIPTION OF THE DRAWINGS

Various embodiments of the present disclosure will hereinafter be described in conjunction with the appended drawings provided to illustrate and not to limit the present disclosure, wherein like designations denote like elements, and in which:

FIG. 3 is a photomicrograph of a cross-sectional view of a cell of a protection circuit for protecting an electronic circuit in accordance with an embodiment;

DETAILED DESCRIPTION OF THE PREFERRED EMBODIMENTS

Figure 1:
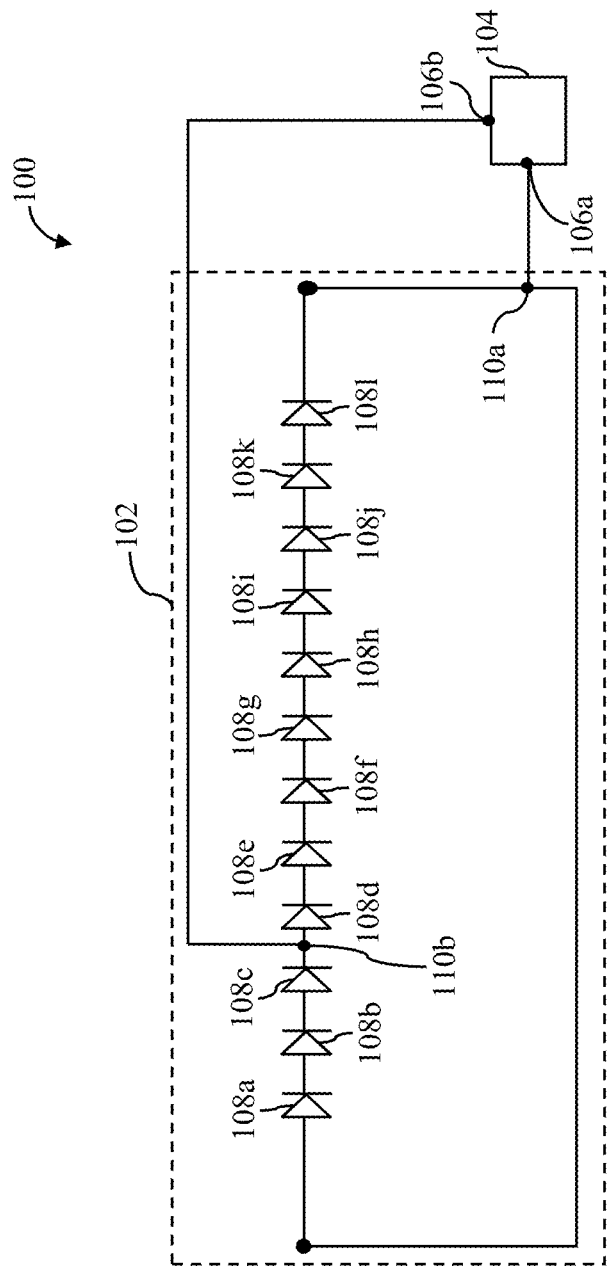
FIG. 1 is a schematic diagram illustrating a protection circuit for protecting an electronic circuit in accordance with an embodiment.

FIG. 1 is a schematic diagram 100 illustrating a protection circuit 102 for protecting an electronic circuit 104 in accordance with an embodiment. In an embodiment, the protection circuit 102 is configured to protect the electronic circuit 104 from ESD. In another embodiment, the protection circuit 102 is configured to protect the electronic circuit 104 from high voltages resulting from an impedance mismatch at an output terminal (hereafter referred to as a second node 106b) of the electronic circuit 104. Examples of the electronic circuit 104 include, but are not limited to, RF power amplifiers, power rectifiers, integrated circuits, DC-to-DC converters, GSM/EDGE power amplifiers, envelope tracking power supply modulators, digital drivers for switching mode power amplifiers, bias circuits, sequencing circuits, detectors, switches, envelope detectors, receivers, low-noise amplifiers, transceivers, and so forth. It should be apparent to a person having ordinary skill in the art that the ongoing description is not limited with respect to the above mentioned examples of the electronic circuit 104. Many other types of electronic circuits can also be protected from ESD and/or conditions arising from voltage mismatches without departing from the scope of the ongoing description.

In an embodiment, a first node 106a of the electronic circuit 104 is connected to a first terminal 110a of the protection circuit 102. The second node 106b of the electronic circuit 104 is connected to a second terminal 110b of the protection circuit 102.

In an embodiment, the first node 106a may be at least one of a ground terminal of the electronic circuit 104, a ground ring around the electronic circuit 104, a highly accelerated stress test (HAST) guard ring around the electronic circuit 104, a biased highly accelerated temperatures/humidity stress test (BHAST) guard ring around the electronic circuit 104, a power supply pin, or other suitable pin capable of sinking and/or sourcing large amount of current, or a power supply terminal of the electronic circuit 104.

In an embodiment, the second node 106b of the electronic circuit 104 is coupled with the second terminal 110b of the protection circuit 102 via a guard ring (not shown in the FIG. 1). In the embodiment, the guard ring is a metallic ring that is an optional electronic component usually connected to a ground terminal and placed around periphery of the electronic circuit 104. In an embodiment, the second node 106b may be an RF output terminal of the electronic circuit 104.

In another embodiment, the first node 106a may be a power supply terminal (such as the positive battery terminal) and the second node 106b may be another power supply terminal (such as the corresponding negative battery terminal).

In yet another embodiment, the second node 106b may be a ground terminal of the electronic circuit 104. It will be apparent to a person having ordinary skill in the art that either the first node 106a or the second node 106b may be one of a ground terminal of the electronic circuit 104.

As shown in FIG. 1, the protection circuit 102 comprises diodes 108a, 108b, 108c, 108d, 108e, 108f, 108g, 108h, 108i, 108j, 108k, and 108l (hereinafter referred to as diodes 108). The diodes 108 are connected in series in such a manner that an anode terminal of any diode (e.g., the diode 108a) is connected to a cathode terminal of another (i.e., consecutive) diode (e.g., the diode 108b). The other diodes (108c-108l) are also connected in a similar fashion as shown. For the simplicity of explanation, the protection circuit 102 is shown and described further with twelve diodes. However, it should be apparent to a person having ordinary skill in the art that the ongoing description is not limited with respect to the number of diodes, and the protection circuit 102 can be implemented using at least three diodes.

Between each of the two consecutive diodes in the ring, respective taps may be provided. The taps can be moved and reconfigured using a design tool, such as a computer aided design (CAD) layout tool to adjust turn-on voltages of a first circuit and a second circuit. It is apparent to a person having ordinary skill in the art that the turn-on voltage corresponds to a voltage required to turn-on forward biased diode(s). The re-configurability or adjustability of the taps allows design, fabrication, testing, and qualification of the protection circuit 102 for different turn-on voltage requirements. The protection circuit 102 can be designed, fabricated, and characterized once, and it can then be quickly reconfigured without re-design, re-fabrication, or re-characterization simply by moving the taps in a design tool (for example, the CAD layout tool). In an embodiment, the taps are implemented in a metal layer in the electronic circuit 104.

In an embodiment, the first terminal 110a and the second terminal 110b divide the ring of diodes 108 in the first circuit and the second circuit. The first terminal 110a is connected between diodes of a first pair of consecutive diodes of the ring, and the second terminal 110b is connected between diodes of a second pair of consecutive diodes of the ring. The first pair of consecutive diodes and the second pair of consecutive diodes may be different.

In an embodiment, the diodes 108 are base-collector diodes fabricated from epitaxial layers of an Indium Gallium Phosphide (InGaP) HBT process. The diodes are optimized in the layout for a higher ratio of periphery-to-area, based on various experimental results. In an embodiment, the diodes 108 can also be constructed from base-emitter or base-collector junctions in bipolar-junction transistor (BJT) or Hetero-junction bipolar transistor (HBT) processes. In alternative embodiments, the diodes 108 can be further constructed from at least one of a Field-Effect Transistor (FET), a Junction Gate Field-Effect Transistor (JFET), an Insulated Gate Bipolar Transistor (IGBT), a Metal-Oxide-Semiconductor Field-Effect Transistor (MOSFET), and a Schottky diode. The diodes 108 may be constructed using suitable semiconductor materials, such as Si, GaAs, and other III-V materials The process of making, the layout, and the size of the diodes 108 may be varied to achieve higher or lower levels of desired ESD protection offered by the protection circuit 102. The design of the protection circuit 102 can be adjusted with additional or fewer diodes (than depicted in FIG. 1) to raise or lower positive and negative turn-on voltages. In an embodiment, the positive and negative turn-on voltages may be independently varied.

The first terminal 110a is connected between diodes of a first pair of the consecutive diodes of the ring, for example the diode 108l and the diode 108a. In an embodiment, position of the first terminal 110a is fixed.

The position of the second terminal 110b is determined based on position of one or more taps of the taps. The one or more taps are selected between one or more second pairs of the diodes 108 in such a manner that a pre-determined turn-on voltage of the diodes 108 in the ring is obtained.

In an embodiment, zero or near zero (very small) additional layout (interchangeably used as die) area is used to implement the protection circuit 102. In the embodiment, the protection circuit 102 is designed to be an integral part of the bond pad structure of the electronic circuit 104. Such a design saves space, which leads to cost savings as layout cost depends on layout area consumed.

In an exemplary embodiment, the operation of the protection circuit 102 is as follows. The number of total diodes (hereinafter referred to as ntotal) in the ring is, by way of example only, 12 (twelve). The number of forward biased diodes (hereinafter referred to as nforward) is 9 (nine) and the number of reverse biased diodes (hereinafter referred to as nreverse) is 3 (three).

The diodes 108d, 108e, 108f, 108g, 108h, 108i, 108j, 108k, and 108l form a string of the nforward diodes. The string of nforward diodes conducts a positive polarity ESD pulse/voltage from the second terminal 110b to the first terminal 110a when a voltage at the second node 106b exceeds the forward turn on voltage of a $$V\text{turn-on\_forward} = (Vce) * n\text{forward}.$$

Where, $V_{ce}$ corresponds to a turn-on voltage of each of the diodes of the diodes 108 in the ring. The turn-on voltage of a diode represents a voltage at which the diode starts conducting current when it is forward-biased.

Thus, when the voltage at the second node 106b exceeds the turn-on voltage of Vturn-on_forward, sufficient current flows into the protection circuit 102, such that the string of diodes 108d, 108e, 108f, 108g, 108h, 108i, 108j, 108k, and 108l, turns on, thereby allowing the positive polarity ESD current to flow from the second node 106b to the first node 106a and thus grounded (if the first node if the ground terminal).

The diodes 108a, 108b, and 108c form a string of the nreverse diodes. The string of nreverse diodes conducts a negative polarity ESD pulse/voltage from the first terminal 110a to the second terminal 110b when a voltage at the first node 106a exceeds the reverse turn on voltage of a $$V\text{turn-on\_reverse} = -(Vce) * n\text{reverse}.$$

Thus, when the voltage at the first node 106a exceeds the turn-on voltage of Vturn-on_reverse, sufficient current flows into the protection circuit 102, such that the string of diodes 108a, 108b, and 108c, turns on, thereby allowing the negative polarity ESD current to flow from the second node 106b to the first node 106a and thus grounded (if the first node if the ground terminal).

Figure 2A:
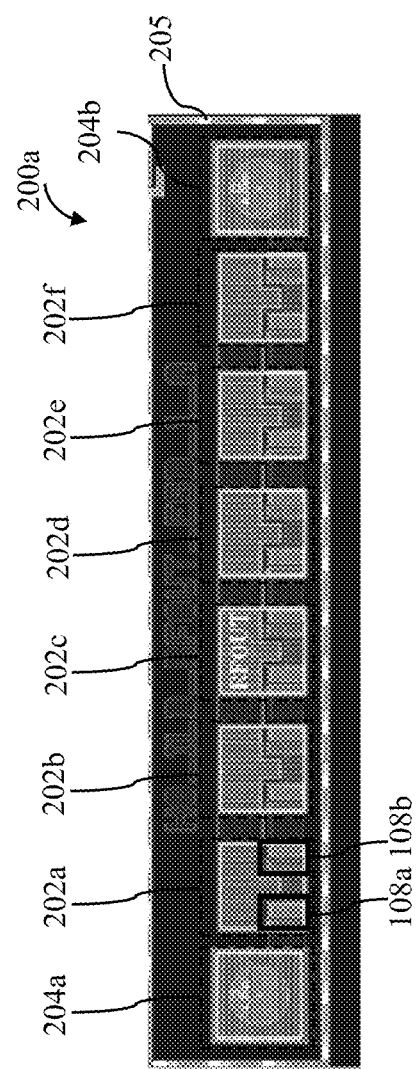
FIG. 2a is a photomicrograph of a layout of a protection circuit for protecting an electronic circuit in accordance with an embodiment.

FIG. 2a is a photomicrograph of a layout 200a of a protection circuit 102 for protecting an electronic circuit 104 in accordance with an embodiment. The layout 200a depicts an array of six cells (202a-202f) interconnected to each other to create the protection circuit 102 for protecting the electronic circuit 104 from electrostatic discharge (ESD) and voltage mismatches. For simplicity of explanation, only a cell 202a of the array of six cells (202a-202f) is described. The cell 202a includes the two diodes (108a, 108b) connected to each other and fabricated under a bond pad. Thus, as shown in FIG. 2a, there are six bond pads, each located above the respective cells (202a-202f). In an embodiment, the bond pad has the similar area as that of the corresponding cell located below the bond pad. In an embodiment, the two diodes (108a, 108b) are base-collector diodes and are rectangular in shape. In an embodiment, other cells (202b-202f) also have similar arrangement of the diodes and bond pads. In another embodiment, the cells (202a-202f) may have different configurations, for example, the number of diodes arranged under a bond pad may be different for each cell depending upon the size of the diodes and the size of the bond pads in each cell.

Slightly larger squares (204a, 204b) on the left and the right ends (with the circles inside the squares) are backside vias which are used to connect to the ground (e.g., metal layer on the back of die). The dashed looking periphery 205 around FIG. 2a is the metal guard ring.

In an embodiment, the layout 200a is fabricated using a semiconductor manufacturing process that starts with an epitaxial wafer. The epitaxial wafer has a semiconductor substrate (semi-insulating GaAs) and further includes semiconductor layers grown on top of the semiconductor substrate (such as, for the collector, sub collector, base, emitter, etc). The epitaxial wafer is then processed in a semiconductor manufacturing line where various layers are etched or deposited. The bond pad (in the present disclosure) consists of gold metal layers which are deposited on top of the semiconductor layers (collector, base etc.). Wire bonds are then thermo-sonically bonded to the bond pads.

In another embodiment the bond pad is redesigned for the flip-chip assembly method where a copper pillar, solder bump or other flip-chip bonding method is used instead of the wire-bonding assembly method.

Figure 2B:
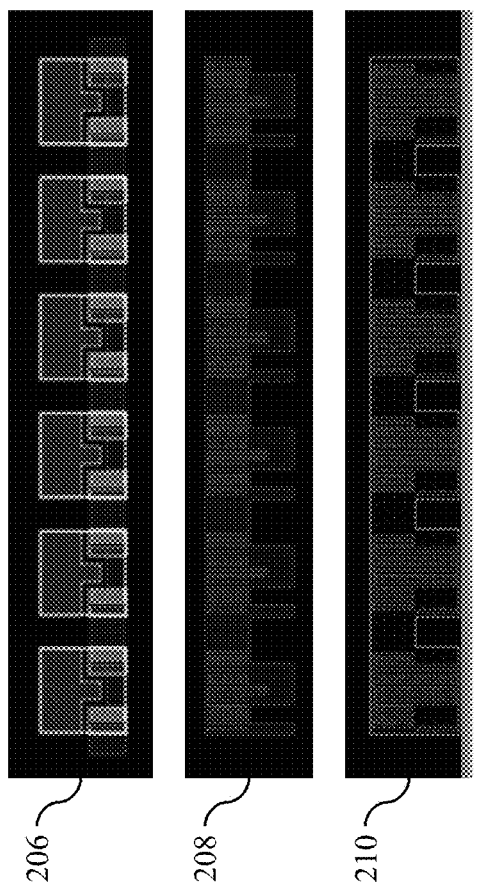
FIG. 2b depicts photomicrographs of layouts of one or more layers of a protection circuit for protecting an electronic circuit in accordance with an embodiment.

In an embodiment, as shown in FIG. 2b, the array of six cells is fabricated in a multilayer arrangement having three layers, namely, a first layer 206, a second layer 208, and a third layer 210. Each of the first layer 206, the second layer 208, and the third layer 210 is made of metal. The vias for interconnecting the first layer 206, the second layer 208, and the third layer 210 are designed with the same size, shape and metal surface as of the Compound Semiconductor Analog/RF Inter Layer Dielectric (ILD) metallization wire-bonding pad. This allows each cell (202a-202f) to be compatible with standard automatic wire-bonding systems including their automatic vision/image recognition systems. The term "via" is referred to as Vertical Interconnect Access, and is a vertical electrical connection between different layers of conductors in a physical electronic circuit. In the embodiment, the "via" is a small opening in an insulating oxide layer that allows a conductive connection between different layers.

In an embodiment, the first layer 206 corresponds to the diodes (which are made of many layers). The first layer 206 further includes the lowest levels of metal including metal-one and collector contact. The second layer 208 corresponds to the metal-two layer and further includes the vias between the metal-one and the metal-two. The third layer 210 corresponds to the metal-three layer and further includes the vias between the metal-two and the metal-three. The third layer 210 is the top most metal layer and the wire bond is bonded to the third layer 210 using a thermo-sonic wire bond process.

In an embodiment, one or more cut-outs are formed above each of the diode (108a, 108b) in order to reduce excessive pressure/force transfer to the two diodes (108a, 108b) which might result in damage such as cracking. The cut outs are formed in the vias of the second layer (see 208 in FIG. 2b) and the vias of the third layer (see 210 in FIG. 2b).

In an embodiment, the first layer 206 contains the metal-one connected to the collector contact in order to provide maximum strength and physical connection. The collector contact is a metal layer which contacts the collector semiconductor layer and has very strong adhesion. The second layer 208 contains an arrangement of vias from the metal-two (down to the metal-one) which is designed to provide both maximum strength and some compressibility (e.g., deliberate deformation/distribution of force) to prevent cracking from excessively concentrated forces on the underlying semiconductor. The third layer 210 contains an arrangement of vias from the metal-three (down to the metal-two) which is designed to provide both maximum strength and some compressibility (e.g., deliberate deformation/distribution of force) to prevent cracking from excessively concentrated forces on the underlying semiconductor.

In an embodiment, each cell (202a-202f) is created in the layout by placement of a standardized and pre-qualified parameterized cell (p-Cell). In an embodiment, a p-Cell is a parameterized cell which is automatically generated by electronic design automation (EDA) software based on the value of its governing parameters. The ESD protection bond pad p-Cell is designed, fabricated, and characterized once. Afterwards, voltages are selected in the design tool by selecting the position of the taps. This reduces design and development costs and speeds qualification and time to market.

FIG. 3 is a photomicrograph of a cross-sectional view of the cell 202a of the protection circuit 102 for protecting an electronic circuit 104 in accordance with an embodiment. As shown in the FIG. 3, a wire bond 302 is located above the third layer 210 (depicted in a dotted shape in FIG. 5). A part of the first layer 206 is depicted in a dotted shape. The first diode 108a and the second diode 108b (depicted in dotted shapes) are formed in the first layer 206. In an embodiment, the first diode 108a and the second diode 108b are rectangular in shape.

Figure 4:
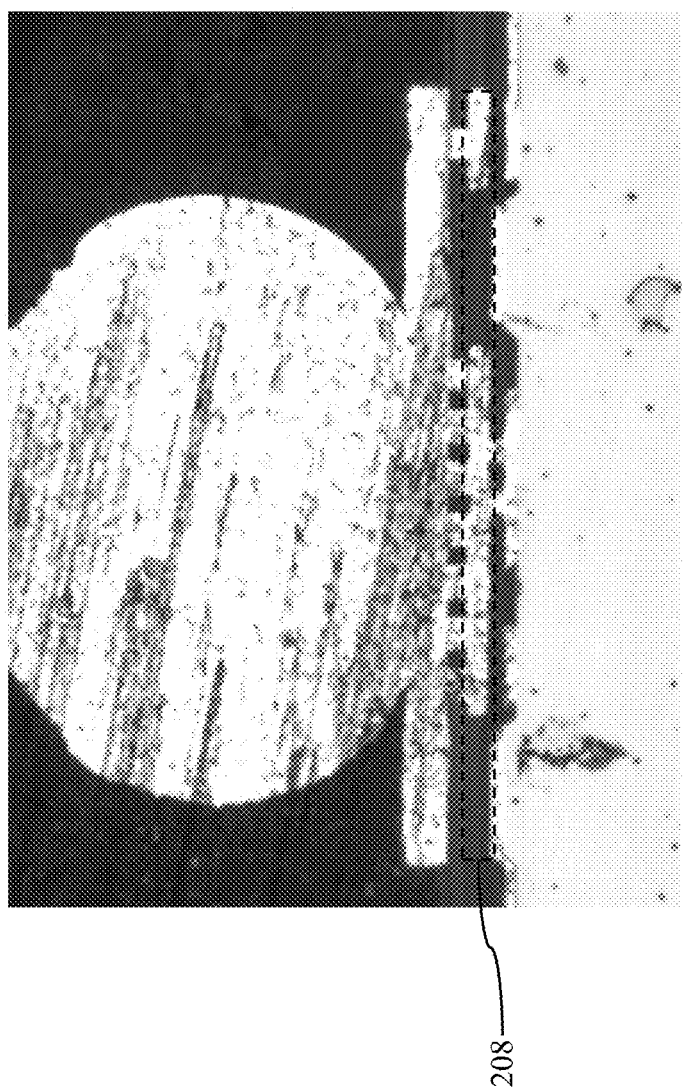
FIG. 4 is a photomicrograph of a cross-sectional view of a cell of a protection circuit for protecting an electronic circuit in accordance with an embodiment.

FIG. 4 is a photomicrograph of a cross-sectional view of the cell 202a of the protection circuit 102 for protecting an electronic circuit 104 in accordance with an embodiment. A part of the second layer 208 is depicted in a dotted shape. The metallic material of the second layer 208 and the vias provide sufficient strength to the second layer 208 to survive wire bonding.

Figure 5:
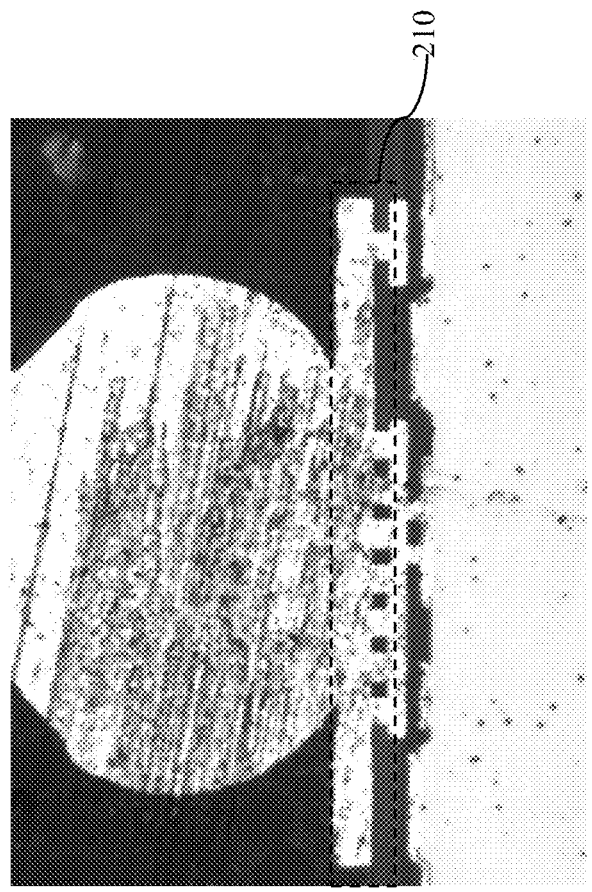
FIG. 5 is a photomicrograph of a cross-sectional view of a cell of a protection circuit for protecting an electronic circuit in accordance with an embodiment.

FIG. 5 is a photomicrograph of a cross-sectional view of the cell 202a of the protection circuit 102 for protecting an electronic circuit 104 in accordance with an embodiment. A part of the third layer 210 is depicted in the dotted shape. The metallic material of the third layer 210 and the vias provide sufficient strength to the third layer 210 to survive wire bonding. In an embodiment, the third layer 210 constitutes the bond pads.

In an embodiment, the third layer 210 includes an arrangement of vias from the metal-three (down to the metal-two) which is designed to provide both maximum strength and some compressibility (deliberate deformation/distribution of force) to prevent cracking from excessively concentrated forces on the underlying semiconductor. In an embodiment, the metal vias are alternated between dielectric so that the resulting structure can compress/deform without cracking of the underlying semiconductor or delamination between the layers of metals and the vias.

Figure 6:
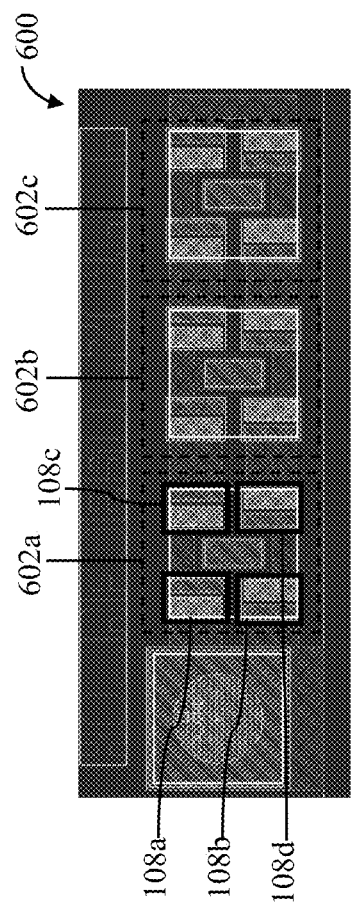
FIG. 6 is a photomicrograph of a layout illustrating a protection circuit for protecting an electronic circuit in accordance with an embodiment.

FIG. 6 is a photomicrograph of a layout 600 of illustrating the protection circuit 102 for protecting an electronic circuit 104 in accordance with an embodiment.

The layout 600 depicts an array of three cells (602a-602c) interconnected to each other to create the protection circuit 102. For simplicity of explanation, only a cell 602a of the array of three cells is described. The cell 602a includes the four diodes (108a-108d) fabricated under a bond pad. The diodes (108a-108d) are connected as explained in FIG. 1. In an embodiment, the four diodes (108a-108d) are base-collector diodes and are rectangular in shape. In an embodiment, other cells (602b and 602c) also have similar arrangement of the diodes and bond pads.

In an embodiment, each cell (602a-602c) is created in the layout by placement of a standardized and pre-qualified parameterized cell (p-Cell). In an embodiment, a p-Cell is a parameterized cell which is automatically generated by electronic design automation (EDA) software based on the value of its governing parameters. The ESD protection bond pad p-Cell is designed, fabricated, and characterized once. Afterwards, voltages are selected in the design tool by selecting the position of the taps. This reduces design and development costs and speeds qualification and time to market.

In an embodiment, the geometry, size, and layout of the diodes may be varied to achieve higher or lower levels of desired electrostatic discharge protection, and to achieve high current handling and low on-state resistance. In another embodiment, the number of the diodes placed under each bond pad may be varied depending upon the requirement, size of the diodes and the size of the bond pad. For example, if an application requires stronger diodes, fewer (but larger) diodes may be placed in each cell. In another example, if an application requires higher turn-on voltages in a smaller space, additional (but smaller) diodes may be placed in each cell.

Various embodiments of the present disclosure provide several advantages. The protection circuit 102 is designed to provide adjustable positive and negative turn-on voltages suitable for various applications. The re-configurability or adjustability of the taps allows rapid layout, fabrication, and implementation of the protection circuit for different turn-on voltage requirements without re-designing, re-testing, and re-characterize. The protection circuit 102 is designed, fabricated, and characterization once. Afterwards, voltages are selected in the design tool by selecting the position of the taps. This reduces design and development costs and speeds qualification and time to market. Further, in an embodiment, as the taps are implemented in a metal layer of the electronic circuit to be protected, the overall space (die area) requirement reduces, resulting in a compact structure of the combination of the protection circuit and the electronic circuit. Further, as the protection circuit is designed to be an integral part of the bond pad structure of the electronic circuit, the overall die area gets reduced, resulting in cost savings.

The protection circuit 102 is suitable for direct connection to RF power amplifier's RF output terminals. The protection circuit 102 achieves very low off-state leakage currents prior to turn-on and very low capacitance. The protection circuit 102 performs with very low parasitic leakage currents and very low parasitic capacitance from the first node 106a with respect to the second node 106b or vice versa. Adjustable symmetric or asymmetric turn-on voltages that are handled by the protection circuit 102 can be re-configured, adjusted, and tailored for a particular application.

While various embodiments of the present invention have been illustrated and described, it will be clear that the present invention is not limited to these embodiments. Numerous modifications, changes, variations, substitutions, and equivalents will be apparent to those skilled in the art without departing from the spirit and scope of the invention, as described in the claims that follow.

What is claimed is:

1. A protection circuit for an electronic circuit, the electronic circuit comprising one or more bond pads, the protection circuit comprising:
   at least three diodes connected in a series, an anode terminal of a first diode being connected to a cathode terminal of a second diode to form a ring;
   a first terminal connected between diodes of a first pair of consecutive diodes of the ring; and
   a second terminal connected between diodes of a second pair of consecutive diodes of the ring, the position of the first terminal being fixed and the position of the second terminal is selectable in such a manner that a pre-determined turn-on voltage of the at least three diodes is obtained,
   wherein the at least three diodes are formed underneath the one or more bond pads of the electronic circuit, and
   wherein the at least three diodes are fabricated in one or more cells underneath the one or more bond pads.

2. The protection circuit of claim 1, wherein the first terminal is coupled to a first node of the electronic circuit to be protected, the first node being at least one of a: ground terminal of the electronic circuit, a ground ring around the electronic circuit, a highly accelerated stress test (HAST) guard ring around the electronic circuit, a biased highly accelerated stress test (BHAST) guard ring around the electronic circuit, a power supply pins, or other suitable pins capable of sinking and/or sourcing large amount of current.

3. The protection circuit of claim 1, wherein the first terminal is grounded.

4. The protection circuit of claim 1, wherein the position of the second terminal is selectable using a design tool without re-designing, re-fabricating, or re-characterizing the protection circuit.

5. The protection circuit of claim 1, wherein the second terminal is coupled to a second node of the electronic circuit, and wherein the second node being a radio frequency (RF) output terminal of the electronic circuit.

6. The protection circuit of claim 1, wherein the at least three diodes is obtained using a Bipolar Junction Transistor (BJT), a Field-Effect Transistor (FET), a Junction Gate Field-Effect Transistor (JFET), an Insulated Gate Bipolar Transistor (IGBT), a Metal-Oxide-Semiconductor Field-Effect Transistor (MOSFET), or a Schottky diode.

7. The protection circuit of claim 1, wherein the at least three diodes are formed underneath the one or more bond pads of the electronic circuit by applying compound semiconductor analog inter layer dielectric (ILD) metallization technique.

8. The protection circuit of claim 7, wherein the protection circuit is configurable to protect the radio frequency (RF) power amplifier circuit from high voltages resulting from an impedance mismatch at an output terminal of the RF power amplifier circuit.

9. The protection circuit of claim 1, wherein the protection circuit comprises a configurable tap removably connectable to the second terminal to adjust turn-on voltage of a first circuit and a second circuit formed using the at least three diodes.

10. The protection circuit of claim 1, wherein the at least three diodes are fabricated out of epitaxial layers of an InGaP HBT process.

11. The protection circuit of claim 1, wherein the first terminal is implemented in a metal layer of the electronic circuit.

12. The protection circuit of claim 1, wherein at least one of geometry, size, or layout of the at least three diodes is varied to achieve required high current handling and low on-state resistance.

13. The protection circuit of claim 1, wherein each of the one or more cells is fabricated in a multilayer arrangement comprising at least a first layer, a second layer, and a third layer.

14. The protection circuit of claim 13, wherein the first layer comprises the at least three diodes.

15. The protection circuit of claim 13 further comprises:
vias for interconnecting the first layer and the second layer; and
vias for interconnecting the second layer and the third layer.

16. The protection circuit of claim 13, wherein the third layer constitutes the one or more bond pads.

17. The protection circuit of claim 1, wherein the bond pad has the similar area as that of the corresponding cell located underneath the bond pad.

18. The protection circuit of claim 1, wherein each cell of the plurality of cells is created by placement of a standardized and pre-qualified parameterized cell (p-Cell).

19. A protection circuit for protecting an electronic circuit from Electrostatic Static Discharge (ESD), the electronic circuit comprising one or more bond pads, the protection circuit comprising:
at least three diodes connected in series, wherein an anode terminal of a first diode is connected to a cathode terminal of a second diode to form a ring;
a first terminal connected between diodes of a first pair of consecutive diodes of the ring; and
a second terminal connected between diodes of a second pair of consecutive diodes of the ring, wherein the position of the first terminal is fixed and the position of the second terminal is selectable in such a manner that a pre-determined turn-on voltage of the at least three diodes is obtained,
wherein the at least three diodes are formed underneath one or more bond pads of the electronic circuit by applying compound semiconductor analog inter layer dielectric (ILD) metallization technique, wherein the at least three diodes are fabricated out of epitaxial layers of an InGaP HBT process, and
wherein the at least three diodes are fabricated in one or more cells underneath the one or more bond pads.

* * * * *